(12) United States Patent
Sindalovsky et al.

(10) Patent No.: US 8,494,092 B2
(45) Date of Patent: Jul. 23, 2013

(54) CDR WITH SIGMA-DELTA NOISE-SHAPED CONTROL

(75) Inventors: Vladimir Sindalovsky, Perkasie, PA (US); Lane Smith, Easton, PA (US); Shawn Logan, Andover, MA (US)

(73) Assignee: LSI Corporation, Milpitas, CA (US)

( * ) Notice: Subject to any disclaimer, the term of this patent is extended or adjusted under 35 U.S.C. 154(b) by 293 days.

(21) Appl. No.: 13/081,941

(22) Filed: Apr. 7, 2011

(65) Prior Publication Data

US 2012/0257693 A1     Oct. 11, 2012

(51) Int. Cl.
*H04L 27/00* (2006.01)

(52) U.S. Cl.
USPC ........... 375/326; 375/215; 375/294; 375/340; 375/371; 375/373

(58) Field of Classification Search
USPC .......... 375/215, 223, 226, 294, 316, 322, 375/326, 327, 340, 371, 373, 376
See application file for complete search history.

(56) References Cited

U.S. PATENT DOCUMENTS

| | | | |
|---|---|---|---|
| 6,317,161 B1 * | 11/2001 | Renner et al. | 348/536 |
| 6,917,317 B2 * | 7/2005 | Nagaso et al. | 341/131 |
| 7,613,267 B2 * | 11/2009 | Perrott et al. | 375/376 |
| 7,633,322 B1 * | 12/2009 | Zhuang et al. | 327/156 |
| 7,692,500 B1 * | 4/2010 | Koukab et al. | 331/17 |
| 8,031,007 B2 * | 10/2011 | Chang et al. | 331/1 A |
| 8,125,362 B1 * | 2/2012 | Bereza | 341/143 |
| 8,259,890 B2 * | 9/2012 | Chen et al. | 375/376 |
| 8,279,992 B1 * | 10/2012 | Li | 375/376 |
| 8,290,113 B2 * | 10/2012 | Marienborg et al. | 377/47 |
| 8,334,726 B2 * | 12/2012 | Kawamoto | 331/17 |
| 2005/0220240 A1 * | 10/2005 | Lesso | 375/372 |
| 2006/0284746 A1 * | 12/2006 | Huang et al. | 341/50 |
| 2007/0001723 A1 * | 1/2007 | Lin | 327/156 |
| 2010/0097150 A1 * | 4/2010 | Ueda et al. | 331/25 |
| 2010/0295586 A1 * | 11/2010 | Weiner | 327/157 |
| 2011/0156777 A1 * | 6/2011 | Wei et al. | 327/157 |
| 2012/0242383 A1 * | 9/2012 | Elad et al. | 327/156 |
| 2013/0057327 A1 * | 3/2013 | Ferriss et al. | 327/156 |

* cited by examiner

*Primary Examiner* — Hirdepal Singh

(57) ABSTRACT

In described embodiments, a receiver includes a clock and data recovery (CDR) module with a voltage control oscillator (VCO) and a Sigma-Delta modulator in an integral loop control of the VCO. Providing finer resolution by the Sigma-Delta modulator reduces quantization noise in the integral control loop when compared to a loop without a Sigma-Delta modulator in the integral loop. Sigma-Delta modulation within the integral loop control of a VCO-based CDR reduces effective quantization of the VCO integral word control, allowing the proportional loop control compensation to i) reduce effective quantization of the VCO integral word control and, ii) enhance receiver jitter tolerance in presence of periodic-jitter, serial data whose frequency is offset from the nominal rate and serial data whose nominal frequency is modulated by a spread spectrum clock.

20 Claims, 4 Drawing Sheets

100

400

CDR WITH SIGMA-DELTA NOISE-SHAPED CONTROL

BACKGROUND OF THE INVENTION

1. Field of the Invention

The present invention relates to communication transceiver clock and data recovery (CDR) circuits, and, in particular, to a CDR incorporating Sigma-Delta circuitry.

2. Description of the Related Art

In many data communication applications, Serializer and De-serializer (SerDes) devices facilitate the transmission between two points of parallel data across a serial link. Data at one point is converted from parallel data to serial data and transmitted through a communications channel to the second point where it received and converted from serial data to parallel data.

At high data rates, frequency-dependent signal loss from the communications channel (e.g., the signal path between the two end points of a serial link) as well as signal dispersion and distortion can occur. As such, the communications channel, whether wired, optical, or wireless, acts as a filter and might be modeled in the frequency domain with a transfer function. Correction for frequency dependent losses of the communications channel, and other forms of signal degradation, often requires signal equalization at a receiver of the signal. Equalization through use of one or more equalizers compensates for the signal degradation to improve communication quality. Equalization may also be employed at the transmit side to pre-condition the signal. Equalization, a form of filtering, generally requires some estimate of the transfer function of the channel to set its filter parameters. However, in many cases, the specific frequency-dependent signal degradation characteristics of a communications channel are unknown, and often vary with time. In such cases, an equalizer with adaptive setting of parameters providing sufficient adjustable range might be employed to mitigate the signal degradation of the signal transmitted through the communications channel. An automatic adaptation process is often employed to adjust the equalizer's response. Equalization might be through a front end equalizer, a feedback equalizer, or some combination of both.

A clock and data recovery (CDR) circuit detects timing of the input data stream and uses such detected timing to set correct frequency and phase of a local clock from which the sampling clock for data sampling is derived. As employed herein, "placing" a sampler (latch) in a data stream requires setting a voltage threshold and clocking phase of the sampler to detect a predetermined point in a data eye. Clocking the data sampler with a clock signal with known frequency and phase derived with respect to the detected symbol timing of data allows for clock recovery of symbols within the data stream generating the data eye.

CDR circuits form a critical part of the receiver in a SerDes device. The objective of the CDR circuit is to track the phase of a sampling clock based on some criterion, such as minimized mean-squared-error (MMSE). To track the phase of a sampling clock based on a given criterion, the CDR circuit generates (timing) error samples with respect to the data sampling clock, and adaptively sets the local clock phase used to derive the data sampling clock so as to minimize the timing error with respect to the criterion between successive sampling events. The CDR circuit desirably operates so as to achieve very low target bit-error-ratio (BER) (usually, on the order of 1e-12 or 1e-15). The CDR circuits commonly employed might be broadly classified into two categories: baud-rate CDR circuits and bang-bang CDR circuits, with each class having associated advantages and disadvantages.

Known methods and devices use direct control of a receiver's VCO (RXVCO) in a digitally controlled CDR. In these methods, one or more D/A converters convert the digital control word(s) from the CDR to an analog control signal to apply to the control voltage input of the VCO. To improve receiver jitter tolerance and overcome the impact of process variation on the VCO, the resolution of the word applied to control the VCO must generally be increased. To minimize the area, power and cost of the CDR and D/A converter(s), the resolution of the control word (i.e., the number of bits contained in the word) applied to the VCO is minimized. However, with a low resolution control word, the VCO output frequency step size produces significant quantization noise. This significant quantization noise results in degraded CDR jitter tolerance to low frequency periodic jitter, especially in those applications where the incoming serial data rate is modulated by a spread spectrum clock. Increasing the resolution of the control word to improve receiver jitter tolerance increases circuit area, increases device power, and increases circuit costs.

FIG. 1 shows an exemplary clock and data recovery (CDR) circuit 100 of prior art systems including receiver VCO (RXVCO) 110. Serial data, after potentially going through linear equalization and decision feedback equalization (DFE), is applied to data slicers 102 which sample data once per unit interval (or more frequently, for oversampling data) to provide samples to phase detector 104, as well as to data recovery circuitry (not shown in FIG. 1). Sampled data provided to phase detector 104 allows CDR 100 to determine sampling clock alignment within the data eye of the received serial data, and performing clock recovery from the incoming serial data. Phase detector 104 generates sampling clock phase adjustments (up or down), thereby providing sampling clock with adjusted frequency and phase to data slicers 102. RXVCO 110 utilizes two control loops, proportional and integral, which allows for more precise tracking of the incoming data rate as its frequency deviates from the nominal rate.

A phase update request from phase detector 104 may utilize majority vote block 106, where multiple phase update requests are converted to a single up, down, or no phase update. The resulting phase update from majority vote block 106 might also be processed by optional gear shifting block 112 and multiplier 108. This processing by optional gear shifting block 112 and multiplier 108 might have a higher multiplication coefficient in the initial phase of locking to a serial data stream, providing for wider bandwidth, in order to reduce time-to-lock of RXVCO 110. After start-up, over the course of time, the gain of gear shifting block 112 and multiplier 108 is reduced, narrowing the CDR loop bandwidth, and, thus, reducing self-jitter characteristic of a non-linear bang-bang phase detector based implementation of CDR 100. The final phase update request from the gear shifting multiplier is applied as a proportional control word to RXVCO 110. RXVCO 110 might be implemented as one or more D/A converters with their outputs fed to the control voltage input(s) of an inductor-capacitor (LC) oscillator with varactor-type control of the frequency, or as a ring-based VCO with current or voltage controlling the delay of its delay stages.

FIG. 2 illustrates frequency ($F_{VCO}$) and phase ($\Phi_{VCO}$) output of basic RXVCO-based CDR operation in the presence of proportional and integral control as a function of time. The output frequency $F_{VCO}$ of RXVCO 110 is a function of integral control word $D_I$ with KVCOi gain and proportional control word $D_P$ with KVCOp gain. Proportional control has a character of pulse width modulation control. Each time proportional control is applied for a limited duration of time, the proportional control causes a temporary change in frequency $F_{VCO}$ of RXVCO 110. As a result, phase $\Phi_{VCO}$ of RXVCO 110 changes by some amount up or down without permanent change to frequency $F_{VCO}$ of RXVCO 110. The frequency ($F_{VCO}$) and phase ($\Phi_{VCO}$) are given by relations (1) and (2).

$$F_{VCO} = F_0 + D_I * KVCO_I + D_P * KVCO_P \tag{1}$$

$$\Phi_{VCO} = \int F_{VCO} dt \tag{2}$$

Returning to FIG. 1, integral control, unlike proportional control, changes for an extended duration of time until limiting integrator 116 accumulates a different integer value. The integer value of limiting integrator 116 is the integral control word applied to RXVCO 110. Processing frequency might be reduced through use of decimated output of phase detector 104 that is provided by decimator 114. Again, as described previously, the integral control is modified at startup through action of gear shifting control and multiplier 109. The integer value of limiting integrator 116 is a coarse quantization of integral control of RXVCO 110, and the fractional value is not used due to RXVCO 110 implementation limitations.

FIG. 3 illustrates effects of coarse quantization of integral control of RXVCO 110 on the tracking ability of CDR 100. As shown in FIG. 3, the adjacent available integral control levels correspond to $F_{VCO1}$ and $F_{VCO2}$, while the target recovered clock should have frequency $F_{CDR}$. Since necessary frequency is not available from RXVCO 110 due to the coarse quantization, the control results in RXVCO 110 switching between $F_{VCO1}$ and $F_{VCO2}$ levels in such a way that, on average, the recovered clock frequency is $F_{CDR}$. Since it takes some time for limiting integrator 116 to switch from one control state to the other due to the integral control loop timing characteristics, RXVCO 110 persists with $F_{VCO1}$ and $F_{VCO2}$ output frequencies for extended periods of time. RXVCO 110 persisting with $F_{VCO1}$ and $F_{VCO2}$ output frequencies for extended periods of time causes the sampling clock phase (line 301) to deviate from the incoming data phase (line 302) before RXVCO 110 switches to a different output frequency and starts reducing the phase error. The resulting phase difference between the sampling clock of the CDR and the actual phase evident between lines 301 and 302 is an error and reduces the ability of the CDR to track the phase of the incoming serial data in the presence of noise and any spread-spectrum modulation of its nominal data rate.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, the present invention allows for control of an oscillation frequency and phase in a receiver. The receiver includes a voltage-controlled oscillator that generates an output signal at the oscillation frequency and phase based on a proportional control word and an integral control word. The receiver further includes a phase detector that generates an oscillation phase error from a sampled data stream. A proportional loop control generates the proportional control word from the oscillation phase error. An integral loop control includes: an integrator, coupled to the phase detector, that integrates the oscillation phase error to provide integer values and fractional values, the integer values equivalent to coarse integral control values, and a sigma-delta modulator that sigma-delta modulates the fractional values to provide fine integral control values. The coarse integral control values and the fine integral control values are combined to provide the integral control word.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with embodiments of the present invention, a receiver includes a clock and data recovery (CDR) circuit with a voltage control oscillator (VCO) having proportional and integral loop control, and a Sigma-Delta modulator in the integral loop control of the VCO. Sigma-Delta modulation within the integral loop control of a VCO-based CDR reduces effective quantization of the VCO integral word control, allowing the proportional loop control compensation to i) reduce effective quantization of the VCO integral word control and, ii) enhance receiver jitter tolerance in presence of periodic-jitter, serial data whose frequency is offset from the nominal rate and serial data generated with, for example, a spread spectrum clock.

Figure 4:
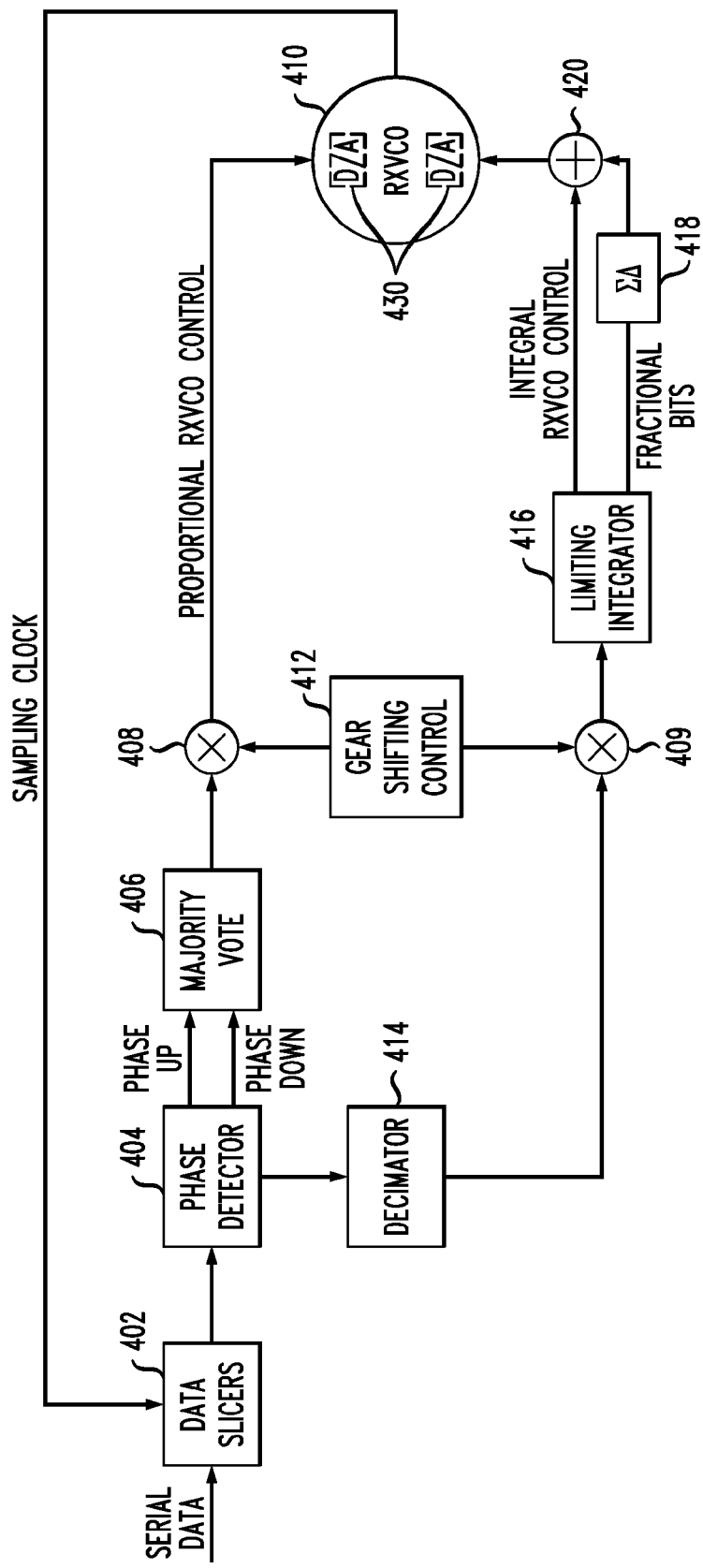
FIG. 4 shows a block diagram of an exemplary CDR system operating in accordance with embodiments of the present invention.

FIG. 4 shows a block diagram of an exemplary CDR system 400 operating in accordance with embodiments of the present invention. CDR system 400 comprises data slicers 402, phase detector 404, decimator 414, majority vote block 406, gear shifting control 412, multipliers 408 and 409, receiver VCO (RXVCO) 410, limiting integrator 416, Sigma-Delta modulator ($\Sigma\Delta$) 418 and combiner 420. Operation of CDR system 400 is now described. RXVCO 410 is shown with digital to analog (D/A) converters 430 employed to convert digital-valued control words to analog signals for control of operation of RXVCO 410.

Serial data is applied to data slicers 402 which sample data once per unit interval (or more frequently, for oversampling data) to provide samples to phase detector 404, as well as to data recovery circuitry (not shown in FIG. 4). Phase detector 404 detects and generates a set of phase error signals for the proportional and integral loop controls from the sampled data stream. Specifically, phase detector 404 generates sampling clock phase adjustments (up or down) that are used to update the sampling clock from the output of the RXVCO 410 provided to data slicers 102 through a controlled output sampling clock derived from the output of RXVCO 410. RXVCO 410 receives input from two loop controls, proportional and integral, such as derived from relations (1) and (2), repeated below:

$$F_{VCO} = F_0 + D_I * KVCO_I + D_P * KVCO_P \quad (1)$$

$$\Phi_{VCO} = \int F_{VCO} dt \quad (2)$$

A phase update request from phase detector 404 might utilize majority vote block 406, where a sequence of multiple phase update requests are converted to a single up, down, or no phase update operation. The resulting phase update from majority vote block 406 might also be processed by optional gear shifting block 412 and multiplier 408. This processing by optional gear shifting block 412 and multiplier 408 might have a higher multiplication coefficient in the initial phase of locking to a serial data stream, providing for wider bandwidth, in order to reduce the time required to phase lock to the incoming serial data rate. After start-up, over the course of time, the gain of gear shifting block 412 and multiplier 408 is reduced, narrowing the bandwidth, and, thus, reducing the self-jitter of the bang-bang phase detector based implementation of CDR 400. The final phase update request from the gear shifting multiplier is applied as a proportional control word to RXVCO 410. RXVCO 410 might be implemented as one or more D/A converters whose outputs serve as the control voltage input to an LC oscillator with varactor-type control of the frequency, or as a ring-based VCO.

The integral control word is generated by integrating, with limiting integrator 416, the output of phase detector 404. The integer value of limiting integrator 416 is the coarse integral control word. Integral control changes for an extended duration of time until limiting integrator 416 accumulates a different integer value. Processing frequency might be reduced through use of decimated output of phase detector 404 that is provided by decimator 414 before integration. As described previously, the integral control is modified at startup through action of gear shifting control and combiner 409.

Fractional bits from limiting integrator 416 are applied to Sigma-Delta modulator 418, whose output can take the value of "1" or "0". As known in the art, the output of Sigma-Delta modulator 418 is equal in average over time to the value of fractional bits. The output of Sigma-Delta modulator 418 is also noise shaped since the quantization noise due to the modulation rate at which its outputs switched between a "0" and "1" is pushed to high frequencies. This action facilitates the ability of the system to filter out the quantization noise in RXVCO 410 and also reduces phase excursions between the serial data rate and the sampling clock generated by CDR system 400. The output of Sigma-Delta modulator 418 is added to the integer bits in combiner 420, providing a fine resolution component to the coarse resolution provided by the integer-valued, integral control word. The output of combiner 420 is then applied to RXVCO 410, creating an effective finer control for the integral loop.

Figure 1:
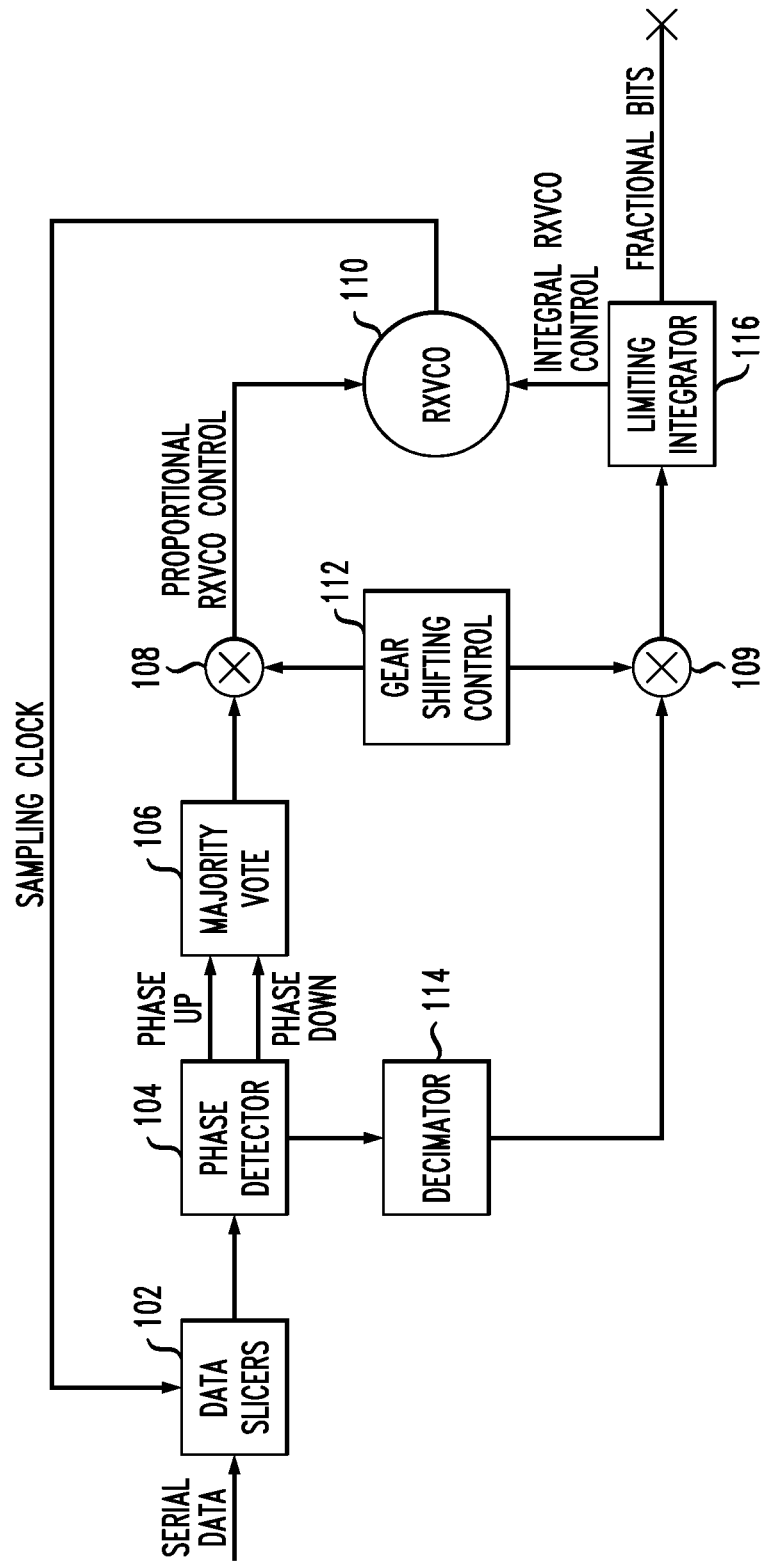
FIG. 1 shows an exemplary clock and data recovery (CDR) circuit of prior art systems.
Figure 2:
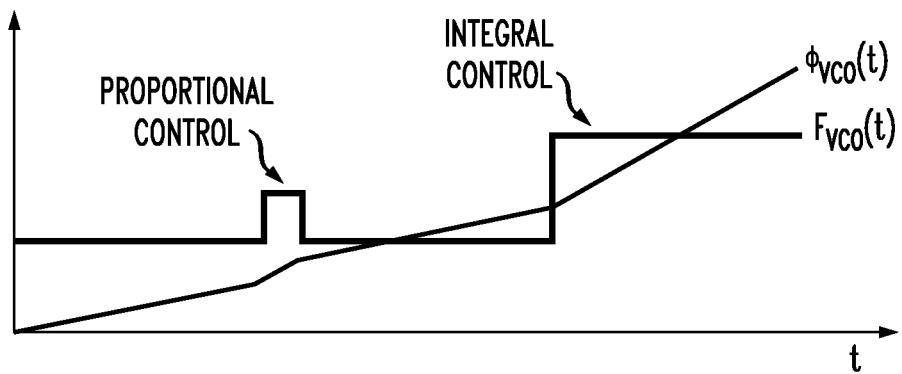
FIG. 2 illustrates frequency and phase output of the prior art CDR operation in the presence of proportional and integral control as a function of time.
Figure 3:
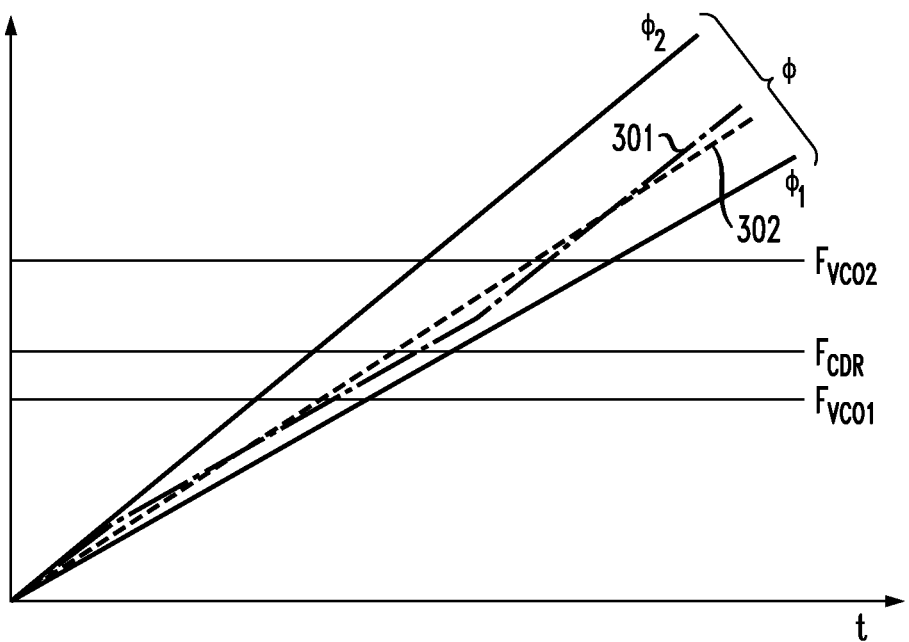
FIG. 3 illustrates effects of coarse quantization of integral control on the tracking ability of the CDR of FIG. 1.
Figure 5:
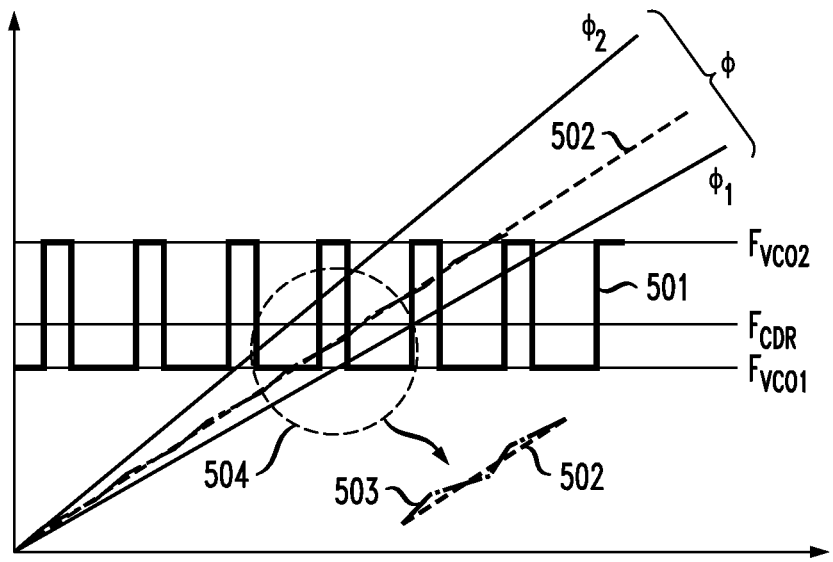
FIG. 5 illustrates effects of fine quantization of integral control of the receiver voltage controlled oscillator of FIG. 4 on the tracking ability of the CDR system.
Figure 6:
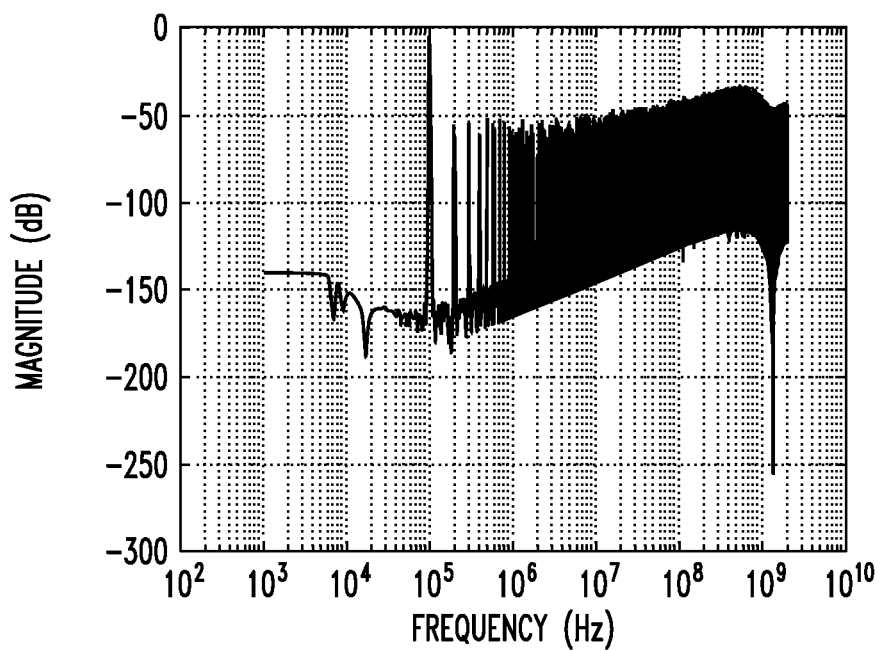
FIG. 6 shows typical noise shaping performed by the Sigma-Delta modulator of FIG. 4.

FIG. 5 illustrates effects of fine quantization of the integral control provided to RXVCO 410 on the tracking ability of CDR system 400. As shown in FIG. 5, the adjacent available integral control levels correspond to $F_{VCO1}$ and $F_{VCO2}$, while the target recovered clock should be at frequency $F_{CDR}$. RXVCO 410 switches at a high frequency when compared to the effects shown in FIG. 3 due to Sigma-Delta noise shaped switching. For example, the update rate of Sigma-Delta modulator 418 might be set by an 8 UI period clock, where 1 UI is the bit time of the serial data. The output value of Sigma-Delta modulator 418 dwells in each state long enough such that the average recovered clock frequency is equal to the expected $F_{CDR}$. Line 501 in FIG. 5 shows the output of RXVCO 410 switching between $F_{VCO1}$ and $F_{VCO2}$ to produce an average rate of $F_{CDR}$. Phase deviation 503 of the recovered clock against the ideal phase (line 502) is also shown. The deviation is relatively small because RXVCO 410 does not stay long in each control state. An expanded view 504 of the phase deviation is also shown in FIG. 5. Typical noise shaping performed by Sigma-Delta modulator 418 is shown in FIG. 6. The degree to which the energy is spread over the frequency band is determined by the fractional part of the integral word. Since phase deviations are small, the proportional loop is not compensating significantly for integral loop deficiencies associated with the large integral word frequency step size, so, the proportional loop is free to respond to periodic jitter, thus increasing receiver jitter tolerance.

A transceiver operating in accordance with one or more embodiments of the present invention might provide for the following advantages. Sigma-Delta modulation within the integral loop control of a VCO-based CDR reduces effective quantization of the VCO integral word control, thus enhancing receiver jitter tolerance in presence of the periodic jitter and jitter tolerance for serial data created using a spread spectrum clock. The transceiver operating in accordance with one or more embodiments of the present invention might exhibit improved performance consistent with a higher resolution CDR integral control word without the impact additional control word resolution on circuit area, complexity, and power. Consequently, such transceiver might exhibit increased reliability in unfavorable communication environments.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

It will be further understood that various changes in the details, materials, and arrangements of the parts which have been described and illustrated in order to explain the nature of this invention may be made by those skilled in the art without departing from the scope of the invention as expressed in the following claims.

We claim:

1. Apparatus for controlling an oscillation frequency and phase in a receiver comprising:
    a voltage-controlled oscillator configured to generate an output signal at the oscillation frequency and phase based on a proportional control word and an integral control word;
    a phase detector configured to generate an oscillation phase error from a sampled data stream;
    a proportional loop control configured to generate the proportional control word from the oscillation phase error;
    an integral loop control comprising:
        an integrator, coupled to the phase detector, configured to integrate the oscillation phase error to provide integer values and fractional values, the integer values equivalent to coarse integral control values having a coarse resolution, and
        a modulator configured to modulate the fractional values to provide fine integral control values having a fine resolution; and
    a combiner configured to combine the coarse integral control values and the fine integral control values to provide the integral control word to the voltage-controlled oscillator.

2. The apparatus of claim 1, wherein the modulator is a Sigma-Delta modulator.

3. The apparatus of claim 1, further comprising data slicers configured to sample input serial data with a sampling clock derived from the output signal of the voltage-controlled oscillator at the oscillation frequency and phase to provide the sampled data stream.

4. The apparatus of claim 1, wherein the integral loop control includes a decimator configured to decimate the output phase error from the phase detector provided to the integrator.

5. The apparatus of claim 1, wherein the integrator is a limiting integrator.

6. The apparatus of claim 1, wherein the proportional loop control includes a majority vote module configured to provide the proportional control word from a series of up and down phase update requests from the oscillation phase error.

7. The apparatus of claim 1, further comprising a gear shifting control configured to provide a first multiplication coefficient in an initial phase of locking the voltage-controlled oscillator to the serial data stream to provide for a wide loop bandwidth to reduce time-to-lock.

8. The apparatus of claim 7, wherein, at a subsequent phase of locking the voltage-controlled oscillator to the serial data stream, the gear shifting control is configured to provide a second multiplication coefficient to provide for a narrow loop bandwidth to reduce self-jitter during steady-state operation.

9. The apparatus of claim 1, wherein the apparatus is embodied in a Serial DeSerializer (SerDes) device.

10. The apparatus of claim 1, wherein the apparatus is embodied in a clock and data recovery circuit.

11. A method of controlling an oscillation frequency and phase in a receiver comprising:
    generating, by a voltage-controlled oscillator, an output signal at the oscillation frequency and phase based on a proportional control word and an integral control word;

generating, by a phase detector, an oscillation phase error from a sampled data stream;

generating the proportional control word from the oscillation phase error;

integrating the oscillation phase error to provide integer values and fractional values, the integer values equivalent to coarse integral control values having a coarse resolution, modulating the fractional values to provide fine integral control values having a fine resolution; and combining the coarse integral control values and the fine integral control values to provide the integral control word.

12. The method of claim 11, wherein the modulating is Sigma-Delta modulating.

13. The method of claim 11, further comprising sampling, with data slicers, input serial data into the sampled data stream with a sampling clock from the output signal of the voltage-controlled oscillator at the oscillation frequency and phase.

14. The method of claim 11, comprising decimating the output phase error from the phase detector prior to integrating the oscillation phase error.

15. The method of claim 11, wherein the integrating is by a limiting integrator.

16. The method of claim 11, comprising generating series of up and down phase update requests from the oscillation phase error and providing the proportional control word from the series of up and down phase update requests via majority vote.

17. The method of claim 11, further comprising locking the voltage-controlled oscillator to the serial data stream, and providing, with a gear shifting control, a first multiplication coefficient in an initial phase for a wide loop bandwidth, thereby reducing time-to-lock.

18. The method of claim 17, wherein, at a subsequent phase of locking the voltage-controlled oscillator to the serial data stream, providing, with the gear shifting control, a second multiplication coefficient for a narrow loop bandwidth, thereby reducing self-jitter during steady-state operation.

19. The method of claim 11, wherein the method is embodied as processing steps in a clock and data recovery circuit of a Serial DeSerializer (SerDes) device.

20. A non-transitory, machine-readable storage medium, having encoded thereon program code, wherein, when the program code is executed by a machine, the machine implements a method for controlling an oscillation frequency and phase in a receiver, comprising the steps of:

generating, by a voltage-controlled oscillator, an output signal at the oscillation frequency and phase based on a proportional control word and an integral control word;

generating, by a phase detector, an oscillation phase error from a sampled data stream;

generating the proportional control word from the oscillation phase error;

integrating the oscillation phase error to provide integer values and fractional values, the integer values equivalent to coarse integral control values, modulating the fractional values to provide fine integral control values; and combining the coarse integral control values and the fine integral control values to provide the integral control word.

* * * * *